(12) United States Patent
Suzuki et al.

(10) Patent No.: US 12,249,912 B2
(45) Date of Patent: Mar. 11, 2025

(54) POWER CONTROL DEVICE AND POWER SUPPLY SYSTEM USING THE SAME

(71) Applicant: TOYOTA JIDOSHA KABUSHIKI KAISHA, Toyota (JP)

(72) Inventors: Yuta Suzuki, Toyota (JP); Naoya Odashima, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 267 days.

(21) Appl. No.: 17/975,992

(22) Filed: Oct. 28, 2022

(65) Prior Publication Data
US 2023/0188036 A1    Jun. 15, 2023

(30) Foreign Application Priority Data

Dec. 15, 2021 (JP) ................................ 2021-203318

(51) Int. Cl.
*H02M 3/158* (2006.01)
*H02M 1/32* (2007.01)
*H05K 7/20* (2006.01)

(52) U.S. Cl.
CPC ............. *H02M 3/158* (2013.01); *H02M 1/32* (2013.01); *H05K 7/209* (2013.01)

(58) Field of Classification Search
CPC ...... H02M 3/158; H02M 1/32; H02J 2310/46; H02J 2310/48; Y02E 60/50
See application file for complete search history.

(56) References Cited

U.S. PATENT DOCUMENTS

| | | | |
|---|---|---|---|
| 2009/0315396 A1* | 12/2009 | Ichikawa | B60L 58/24 307/9.1 |
| 2011/0127974 A1* | 6/2011 | Fukushi | H02M 3/156 323/271 |
| 2019/0214913 A1* | 7/2019 | Murakami | H02P 29/68 |

FOREIGN PATENT DOCUMENTS

| | | |
|---|---|---|
| JP | 2005-346948 A | 12/2005 |
| JP | 2008-110700 A | 5/2008 |
| JP | 2010-115011 A | 5/2010 |
| JP | 2016-197971 A | 11/2016 |

* cited by examiner

*Primary Examiner* — Alex Torres-Rivera
(74) *Attorney, Agent, or Firm* — Oliff PLC

(57) ABSTRACT

A power control device comprising: a step-down converter configured to step down DC power supplied from a DC power source; a temperature sensor configured to detect a temperature of the step-down converter or a temperature correlated therewith; and a control device configured to control an operation of the step-down converter based on a target value for an output voltage of the step-down converter. The control device is configured to change the target value between at least two values in response to the temperature detected by the temperature sensor.

7 Claims, 2 Drawing Sheets

FIG. 2

| VH [V] | T [°C] | VLL [V] | VLH [V] |
|---|---|---|---|
| 700 | -40 | 290 | 348 |
| | 40 | 290 | 348 |
| | 65 | 270 | 319 |
| | 110 | 270 | 319 |
| 750 | -40 | 290 | 348 |
| | 40 | 290 | 348 |
| | 65 | 268 | 319 |
| | 110 | 268 | 319 |

POWER CONTROL DEVICE AND POWER SUPPLY SYSTEM USING THE SAME

CROSS-REFERENCE TO RELATED APPLICATION

This application claims priority to Japanese Patent Application No. 2021-203318 filed on Dec. 15, 2021, incorporated herein by reference in its entirety.

BACKGROUND

1. Technical Field

A technique disclosed in the present specification relates to a power control device and a power supply system using the same.

2. Description of Related Art

Japanese Unexamined Patent Application Publication No. 2008-110700 (JP 2008-110700 A) describes a power control device. The power control device includes a step-down converter that steps down direct current power supplied from a direct current power source, and a control device that controls the operation of the step-down converter.

SUMMARY

In recent years, the direct current power source has been increased in voltage, and as a result, an increase in temperature in the power control device is becoming a problem. In particular, in the step-down converter, as the step-down ratio (the ratio of the input voltage to the output voltage) increases, a larger ripple (pulsation) is likely to occur in the current flowing in the reactor or the like. The occurrence of such a ripple may increase the amount of heat generated by the reactor and excessively increase the temperature of the reactor.

In view of the above, the present specification provides a power control device and a power supply system using the same.

A power control device according to a first aspect of the present disclosure includes: a step-down converter configured to step down direct current power supplied from a direct current power source; a temperature sensor configured to detect a temperature of the step-down converter or a temperature correlated with the temperature of the step-down converter; and a control device configured to control operation of the step-down converter based on a target value for an output voltage of the step-down converter. In this case, the control device is configured to change the target value between at least two values in accordance with a detected temperature detected by the temperature sensor.

According to such a configuration, the target value for the output voltage of the step-down converter can be changed between at least two values in accordance with the temperature of the step-down converter. For example, when the temperature of the step-down converter is relatively high, the target value for the output voltage of the step-down converter can be set to a relatively low value. Thus, the ripple of the current flowing through the step-down converter can be reduced. As a result, the amount of heat generated in the step-down converter decreases, and thus the temperature rise of the step-down converter can be suppressed. On the other hand, when the temperature of the step-down converter is relatively low, the target value for the output voltage of the step-down converter can be set to a relatively high value. Thus, when a further temperature rise of the step-down converter is allowed, it is possible to output more power from the step-down converter without unnecessarily limiting the performance of the step-down converter.

In the power control device according to the first aspect, the target value may include an upper limit target value and a lower limit target value, and the control device may be configured to change at least one of the upper limit target value and the lower limit target value in accordance with the detected temperature.

In the power control device according to the first aspect, the control device may be configured to change each of the upper limit target value and the lower limit target value in accordance with the detected temperature.

According to such a configuration, it is possible to more appropriately suppress the temperature rise of the step-down converter.

In the power control device according to the first aspect, the control device may be configured to set the upper limit target value to a first value when the detected temperature is within a first temperature range, and set the upper limit target value to a second value lower than the first value when the detected temperature is within a second temperature range higher than the first temperature range.

In the power control device according to the first aspect, the control device may be configured to set the lower limit target value to a third value when the detected temperature is within the first temperature range, and set the lower limit target value to a fourth value lower than the third value when the detected temperature is within the second temperature range higher than the first temperature range.

In the power control device according to the first aspect, the second value may be set to a value larger than the third value.

According to such a configuration, the range in which the detected temperature is within the first temperature range and the output voltage of the step-down converter is maintained (that is, equal to or larger than the third value and equal to or smaller than the first value), and the range in which the detected temperature is within the first temperature range and the output voltage of the step-down converter is maintained (that is, equal to or larger than the fourth value and equal to or smaller than the second value) partially overlap. Thus, when the target value is changed, the output voltage of the step-down converter can be avoided from fluctuating significantly.

The power control device according to the first aspect may further include a cooling circuit configured to circulate a heat medium to cool the step-down converter. In this case, the temperature sensor may be configured to detect a temperature of the heat medium.

In the power control device according to the first aspect, the direct current power source may include a fuel cell.

A power supply system according to a second aspect of the present embodiment includes the power control device described above, and a direct current power source for supplying direct current power to the step-down converter of the power control device.

In the power supply system according to the second aspect, the direct current power source may include a fuel cell.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein:

FIG. 2 is an example of the target value set by the control device 20. The column "VH" in the figure indicates the input voltage to the step-down converter 14, and the column "T" indicates the detected temperature of the temperature sensor 34. The column "VLL" indicates the lower limit target value with respect to the output voltage VL of the step-down converter 14, and the column "VLH" indicates the upper limit target value with respect to the output voltage VL of the step-down converter 14.

DETAILED DESCRIPTION OF EMBODIMENTS

Figure 1:
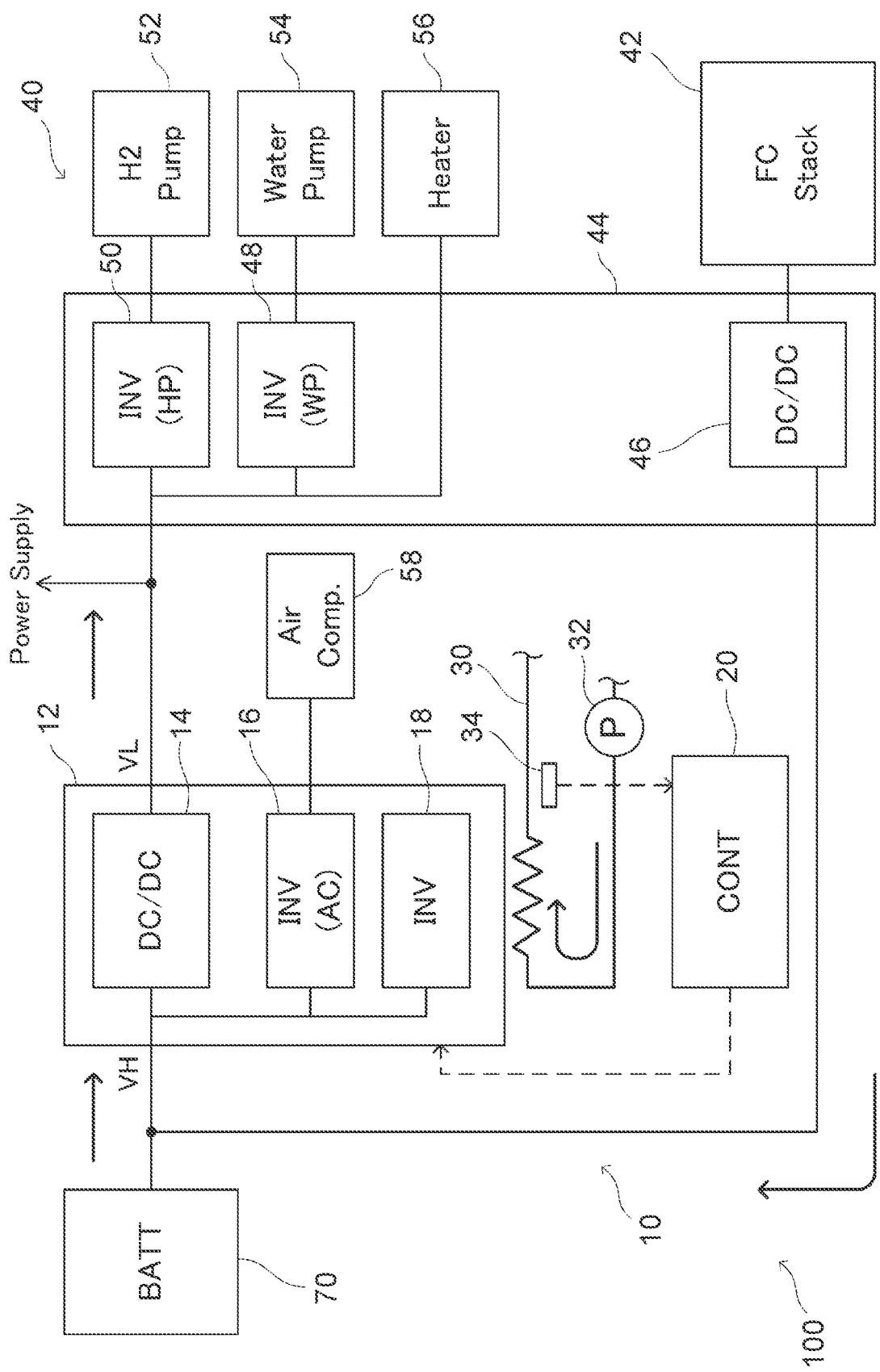
FIG. 1 is a block diagram schematically showing a configuration of a power control device 10 of an embodiment and a power supply system 100 using the same.

The power control device 10 of the embodiment and the power supply system 100 employing the same will be described with reference to the drawings. The power control device 10 and the power supply system 100 of the present embodiment are not particularly limited, but may be employed as a power source in various types of mobile objects such as vehicles, ships, flying objects, and robots. Alternatively, the power control device 10 and the power supply system 100 can be adopted as a power source for devices and equipment in a home or a business office.

As illustrated in FIG. 1, the power supply system 100 of the present embodiment includes a power control device 10, a fuel battery unit 40, and a battery unit 70. The fuel battery unit 40 and the battery unit 70 are DC power sources that supply DC power to the power control device 10. Although not particularly limited, the battery unit 70 includes a plurality of lithium ion batteries that are secondary batteries, and is charged by the generated electric power of the fuel battery unit 40. Although not particularly limited, the rated voltage of the fuel battery unit 40 may be 400 volts to 900 volts. The DC power source may include a secondary battery such as a lithium ion battery.

The DC power from the fuel battery unit 40 and the battery unit 70 is stepped down in the power control device 10 and then supplied to the outside. A part of the electric power output from the power control device 10 is supplied to the fuel battery unit 40 and consumed as the operating power of the fuel battery unit 40. Hereinafter, the fuel battery unit 40 and the battery unit 70 may be collectively referred to as DC power sources 40 and 70.

The power control device 10 includes a power conversion unit 12 and a control device 20 that controls the operation of the power conversion unit 12. The power conversion unit 12 includes a step-down converter 14 and two inverters 16 and 18. The step-down converter 14 is electrically connected to the DC power sources 40 and 70, and can step down the DC power supplied from the DC power sources 40 and 70. That is, the output voltage VL from the step-down converter 14 is lower than the input voltage VH to the step-down converter 14. The step-down specific VH/VL of the step-down converter 14 may be, for example, 1.2 to 3.0, but the specific numerical value thereof is not particularly limited. Although not shown, the step-down converter 14 includes a reactor, a diode, and a switching element.

Each of the two inverters 16 and 18 can convert the DC power supplied from the DC power sources 40 and 70 into three-phase AC power. Of the two inverters 16 and 18, one inverter 16 is connected to an air compressor 58 of a fuel battery unit 40, which will be described later, and the inverter 16 supplies three-phase AC power to the air compressor 58.

The control device 20 controls the operations of the step-down converter 14 and the two inverters 16 and 18, respectively. In particular, the control device 20 is configured to control the operation of the step-down converter 14 based on a target value for the output voltage VL of the step-down converter 14. This point will be described in detail later. Although not particularly limited, the control device 20 of the present embodiment is configured using a computer device, and includes a memory in which a necessary control program is recorded, and a processor that executes the control program recorded in the memory.

The control device 20 further comprises a cooling circuit 30 for cooling the power conversion unit 12. The cooling circuit 30 can cool the step-down converter 14 and the inverters 16 and 18 included in the power conversion unit 12 by circulating a heat medium such as coolant. The cooling circuit 30 is provided with a circulation pump 32 for circulating the heat medium and a temperature sensor 34 for measuring the temperature of the heat medium. The temperature sensor 34 is connected to the control device 20, and the temperature detected by the temperature sensor 34 is configured to be transmitted to the control device 20. The temperature detected by the temperature sensor 34 correlates with the temperature of the step-down converter 14 included in the power conversion unit 12.

The fuel battery unit 40 includes a fuel cell stack 42 and a power conversion unit 44 connected to the fuel cell stack 42. The fuel cell stack 42 can generate electricity by reacting hydrogen and oxygen. Although not particularly limited, the rated voltage of the fuel battery unit 40 may be 100 volts to 500 volts. The generated power of the fuel cell stack 42 is supplied to the battery unit 70 and the step-down converter 14 of the power control device 10 via the power conversion unit 44 of the fuel battery unit 40. The power conversion unit 44 of the fuel battery unit 40 includes a DC-DC converter 46 and a plurality of inverters 48 and 50. DC-DC converters 46 boost the generated electric power of the fuel cell stacks 42 in accordance with the rated voltage of the battery unit 70. Each of the two inverters 48 and 50 converts the DC power from the step-down converter 14 into three-phase AC power.

The fuel battery unit 40 further includes a hydrogen circulation pump 52, a coolant pump 54, a heater 56, and an air compressor 58. The hydrogen circulation pump 52 discharges the water generated by the power generation from the fuel cell stack 42 and recirculates the unreacted gas to the fuel cell stack 42. The hydrogen circulation pump 52 is connected to one of the inverters 50 of the power conversion unit 44 and is operated by power supplied from the inverter 50. The coolant pump 54 circulates the cooling water to the fuel cell stack 42. The coolant pump 54 is connected to the other inverter 48 of the power conversion unit 44 and is operated by the power supplied from the inverter 48. The heater 56 heats the fuel cell stack 42 when it starts at a low temperature. The heater 56 is connected to the step-down converter 14 and is operated by DC power from the step-down converter 14. The air compressor 58 pumps oxygen for reaction to the fuel cell stack 42. As described above, the air compressor 58 is operated by the power supplied from the inverter 16 of the power control device 10.

With the above configuration, the power supply system 100 of the present embodiment can generate electric power by the fuel battery unit 40 and store the generated electric power of the fuel battery unit 40 in the battery unit 70. The generated power of the fuel battery unit 40 and the discharged power of the battery unit 70 can be supplied to the outside via the power conversion unit 12. The power conversion unit 12 includes a step-down converter 14, and can step down the high-voltage DC voltage supplied from the fuel battery unit 40 or the battery unit 70 to a DC voltage suitable for external supply. As a result, for example, the battery unit 70 can be increased in pressure, and the battery unit 70 can be efficiently charged and discharged.

Next, the operation of the control device 20 will be described. As described above, the control device 20 is configured to control the operation of the step-down converter 14 based on the target value with respect to the output voltage VL of the step-down converter 14. In this regard, the control device 20 is configured to change the target value for the output voltage VL of the step-down converter 14 between at least two values in response to the temperature detected by the temperature sensor 34 of the cooling circuit 30. Here, the temperature detected by the temperature sensor 34 correlates with the temperature of the step-down converter 14. Therefore, the target value for the output voltage VL of the step-down converter 14 is changed in accordance with the temperature of the step-down converter 14.

FIG. 2 shows an example of a target value set by the control device 20. In the control device 20 of the present embodiment, the lower limit target value VLL and the upper limit target value VLH are set as the target values. The control device 20 is configured to control the operation of the step-down converter 14 so that the output voltage VL of the step-down converter 14 is maintained between the lower limit target value VLL and the upper limit target value VLH.

As shown in FIG. 2, when the input voltage VH to the step-down converter 14 is 700 volts, the lower limit target value VLL is set to either 290 volts or 270 volts, and the upper limit target value VLH is set to either 348 volts or 319 volts. Specifically, when the detected temperature of the temperature sensor 34 is less than 65° C., the lower limit target value VLL is set to 290 volts, and the upper limit target value VLH is set to 348 volts. On the other hand, when the temperature detected by the temperature sensor 34 is 65° C. or higher, the lower limit target value VLL is set to 270 volts, and the upper limit target value VLH is set to 319 volts. As described above, each of the lower limit target value VLL and the upper limit target value VLH is changed in accordance with the detected temperature of the temperature sensor 34, and in particular, a relatively low value is set when the detected temperature of the temperature sensor 34 is high.

Similarly, when the input voltage VH to the step-down converter 14 is 750 volts, each of the lower limit target value VLL and the upper limit target value VLH is changed in accordance with the temperature detected by the temperature sensor 34. In particular, when the temperature detected by the temperature sensor 34 is 65° C. or higher, a relatively low value is set for each of the lower limit target value VLL and the upper limit target value VLH. That is, when the detected temperature of the temperature sensor 34 is less than 65° C., the lower limit target value VLL is set to 290 volts, and the upper limit target value VLH is set to 348 volts. On the other hand, when the temperature detected by the temperature sensor 34 is 65° C. or higher, the lower limit target value VLL is set to 268 volts, and the upper limit target value VLH is set to 319 volts.

As described above, in the power control device 10 of the present embodiment, when the temperature of the step-down converter 14 is relatively high, the target values VLL and VLH of the output voltage VL of the step-down converter 14 can be set to a relatively low value. Thus, the ripple of the current flowing through the step-down converter 14 can be reduced. As a result, the amount of heat generated in the step-down converter 14 is reduced, so that the temperature rise of the step-down converter 14 can be suppressed. On the other hand, when the temperature of the step-down converter 14 is relatively low, the target values VLL and VLH of the output voltage VL of the step-down converter 14 can be set to relatively high values. Accordingly, when a further temperature increase of the step-down converter 14 is permitted, it is possible to output more power from the step-down converter 14 without unnecessarily limiting the performance of the step-down converter 14. The control device 20 may be configured to change the upper limit target value VLH between three or more values in accordance with a range of the detected temperature by the temperature sensor 34.

Here, when the temperature detected by the temperature sensor 34 is relatively high and the target values VLL and VLH are set to low values, the output power of the step-down converter 14 is limited. However, it is not assumed that the heater 56 of the fuel battery unit 40 is used in a situation in which the temperature detected by the temperature sensor 34 is increased (that is, in a situation in which the temperature of the step-down converter 14 is increased). Therefore, even if the target values VLL and VLH are set to low values, it is not normally assumed that the output power of the step-down converter 14 is insufficient.

In the power control device 10 of the present embodiment, the control device 20 is configured to change each of the upper limit target value VLH and the lower limit target value VLL in accordance with the detected temperature. However, as another embodiment, the control device 20 may be configured to change only one of the upper limit target value VLH and the lower limit target value VLL in accordance with the detected temperature.

The width of changing the target values VLL and VLH in accordance with the temperature detected by the temperature sensor 34 is not particularly limited. However, if the target values VLL and VLH are excessively changed, there is a possibility that the output voltage VL of the step-down converter 14 greatly fluctuates before and after the change. In this regard, in the power control device 10 of the present embodiment, the upper limit target value VLH (for example, 319 volts) at high temperature is set to a value larger than the lower limit target value VLL (290 volts) at low temperature. According to such a configuration, the range in which the output voltage VL of the step-down converter 14 is maintained at a high temperature (270 volts or more and 319 volts or less) partially overlaps with the range in which the output voltage VL of the step-down converter 14 is maintained at a low temperature (290 volts or more and 348 volts or less). According to such a configuration, it is possible to avoid a large fluctuation in the output voltage VL of the step-down converter 14 before and after the change of the target values VLL and VLH.

Although the embodiment of the present technology has been described in detail above, the embodiment is merely an example and does not limit the scope of claims. The techniques described in the claims include various modifications and alternations of the specific examples illustrated above. The technical elements described in the present specification or the drawings exhibit technical usefulness alone or in various combinations, and are not limited to the combinations described in the claims at the time of filing. In addition, the techniques illustrated in the present specification or drawings can achieve a plurality of objectives at the same time, and achieving one of the objectives itself has technical usefulness.

What is claimed is:

1. A power control device comprising:
a step-down converter configured to step down direct current power supplied from a direct current power source;
a temperature sensor configured to detect a temperature of the step-down converter or a temperature correlated with the temperature of the step-down converter; and
a control device configured to control operation of the step-down converter based on upper limit and lower limit target values for an output voltage of the step-down converter, wherein
the control device is further configured to:
    change at least one of the upper limit target value and the lower limit target value in accordance with the detected temperature,
    set the upper limit target value to a first value when the detected temperature is within a first temperature range,
    set the upper limit target value to a second value lower than the first value when the detected temperature is within a second temperature range higher than the first temperature range,
    set the lower limit target value to a third value when the detected temperature is within the first temperature range, and
    set the lower limit target value to a fourth value lower than the third value when the detected temperature is within the second temperature range.

2. The power control device according to claim 1, wherein the control device is configured to change each of the upper limit target value and the lower limit target value in accordance with the detected temperature.

3. The power control device according to claim 1, wherein the second value is set to a value larger than the third value.

4. The power control device according to claim 1, further comprising a cooling circuit configured to circulate a heat medium to cool the step-down converter, wherein the temperature sensor is configured to detect a temperature of the heat medium.

5. The power control device according to claim 1, wherein the direct current power source includes a fuel cell.

6. A power supply system comprising:
the power control device according to claim 1; and
a direct current power source for supplying direct current power to the step-down converter of the power control device.

7. The power supply system according to claim 6, wherein the direct current power source includes a fuel cell.

* * * * *